US012587144B2

(12) United States Patent
Tam et al.

(10) Patent No.: US 12,587,144 B2
(45) Date of Patent: Mar. 24, 2026

(54) POWER AMPLIFIER (PA) SELF-HEATING TRACKING FOR WITH SELF-HEATING TIME CONSTANT ESTIMATION

(71) Applicant: NXP USA, Inc., Austin, TX (US)

(72) Inventors: Sai-Wang Tam, Sunnyvale, CA (US); Viet Thanh Dinh, Austin, TX (US); Juan Xie, Cupertino, CA (US); Alden C Wong, Sunnyvale, CA (US); Tian Liu, Los Angeles, CA (US); Sri Harsha Kondapalli, Santa Clara, CA (US); Sa-Wey Wu, San Jose, CA (US); Ovidiu Carnu, Scotts Valley, CA (US)

(73) Assignee: NXP USA, Inc., Austin, TX (US)

( * ) Notice: Subject to any disclaimer, the term of this patent is extended or adjusted under 35 U.S.C. 154(b) by 506 days.

(21) Appl. No.: 18/144,803

(22) Filed: May 8, 2023

(65) Prior Publication Data

US 2024/0380365 A1 Nov. 14, 2024

(51) Int. Cl.
*H03F 3/21* (2006.01)
*H03F 1/30* (2006.01)

(52) U.S. Cl.
CPC .............. *H03F 1/301* (2013.01); *H03F 3/21* (2013.01); *H03F 2200/447* (2013.01); *H03F 2200/451* (2013.01)

(58) Field of Classification Search
CPC ...... H03F 1/301; H03F 3/21; H03F 2200/447; H03F 2200/451
USPC ......................................................... 330/289
See application file for complete search history.

(56) References Cited

U.S. PATENT DOCUMENTS

| | | | |
|---|---|---|---|
| 10,305,433 B2 * | 5/2019 | Ranta | ........................ H03F 1/30 |
| 11,251,752 B2 | 2/2022 | Najjari et al. | |
| 2018/0062585 A1 * | 3/2018 | Quaglietta | ................ H03F 3/19 |

OTHER PUBLICATIONS

Liu, S. L. et al.; "Self-Heating Temperature Behavior Analysis for DC—GHz Design Optimization in Advanced FinFETs"; 2019 Symposium on VLSI Technology, Jun. 9-14, 2019, Kyoto, Japan; DOI: 10.23919/VLSIT.2019.8776496.
Jindal, Gautam et al. "Digital Predistortion of RF Power Amplifiers Robust to a Wide Temperature Range and Varying Peak-to-Average Ratio Signals," in IEEE Transactions on Microwave Theory and Techniques, vol. 70, No. 7, pp. 3675-3687.
Taghikhani, Parastoo et al. "Temperature-Dependent Characterization of Power Amplifiers Using an Efficient Electrothermal Analysis Technique," in IEEE Transactions on Microwave Theory and Techniques, vol. 70, No. 2, Feb. 2022, pp. 1349-1360.
Najjari, Hamza, "Power Amplifier Design Based on Electro-Thermal Considerations", (2019), 117 pgs.
Boumaiza, S. et al. "Thermal memory effects modeling and compensation in RF power amplifiers and predistortion inearizers," in IEEE Transactions on Microwave Theory and Techniques, vol. 51, No. 12, Dec. 2003, pp. 2427-2433.

* cited by examiner

*Primary Examiner* — Andrea Lindgren Baltzell
*Assistant Examiner* — Nareh Shamiryan

(57) ABSTRACT

Embodiments of self-heating tracking circuits for a power amplifier (PA) are disclosed. In an embodiment, a self-heating tracking circuit for a PA includes a PA replica circuit in proximity to the PA and an estimation unit configured to estimate a self-heating time constant of the PA in response to turning on the PA replica circuit and turning off the PA replica circuit.

20 Claims, 9 Drawing Sheets

ACTIVE RF (HEAT SOURCE)
602

PA REPLICA CIRCUIT
618

DUMMY
620

600

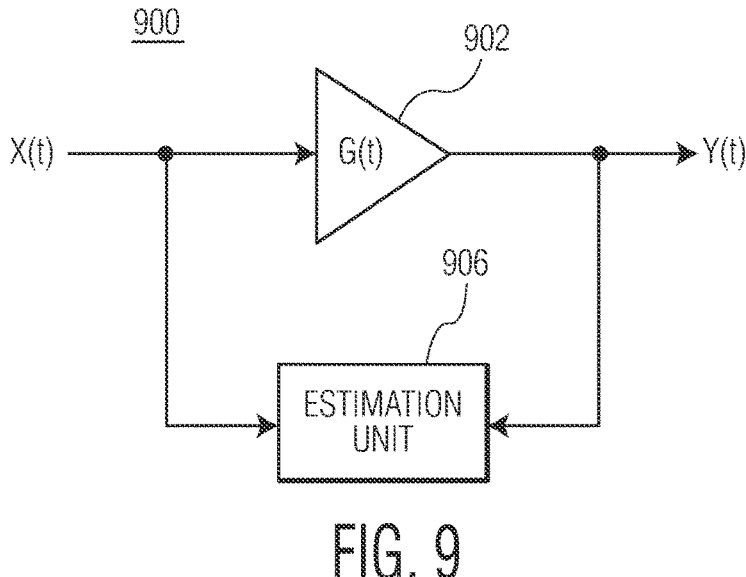
FIG. 9
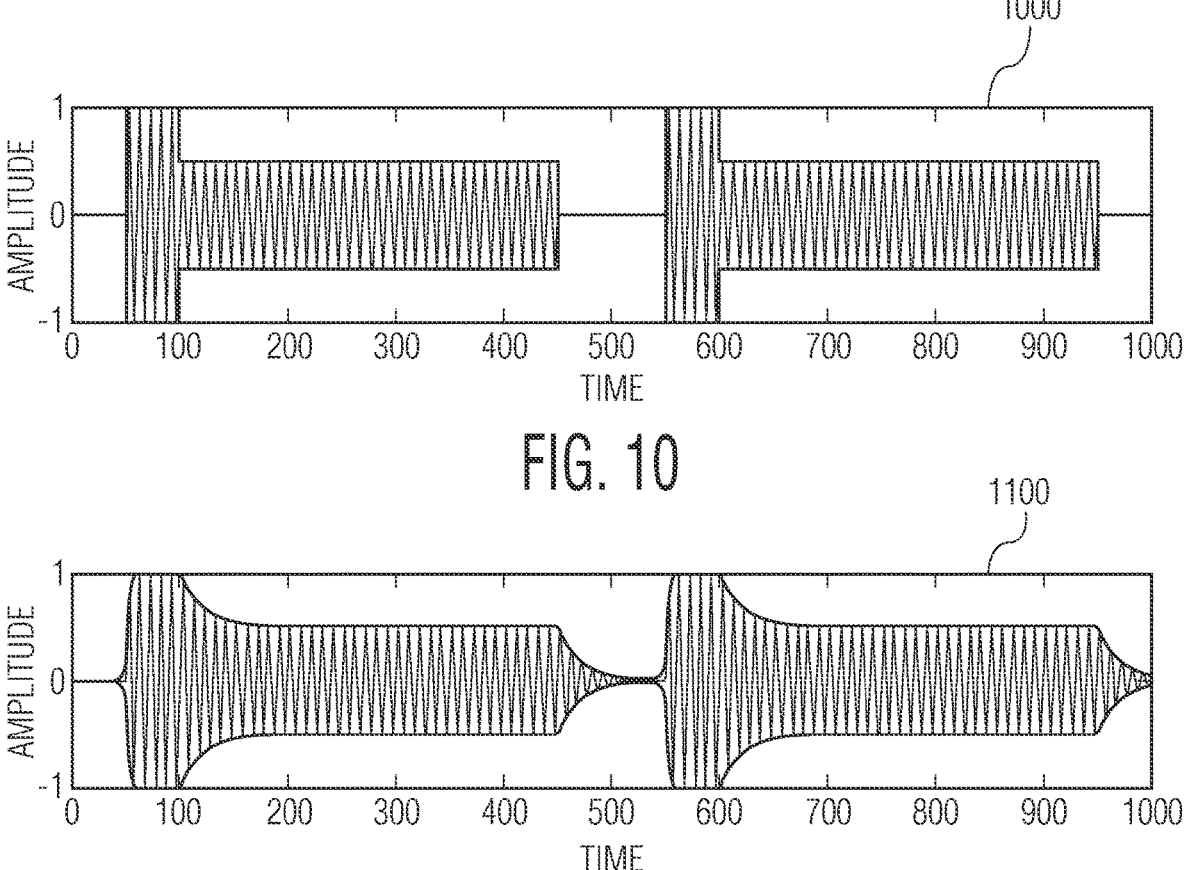
FIG. 10
FIG. 11

RISE TIME FIT:

$$a \left(1 - \exp\left(-\frac{t}{\tau_{rise}}\right)\right)$$

USE LEASTSQUARES
METHOD TO ESTIMATE
$\tau_{rise}$

FALL TIME FIT:

$$a \exp\left(-\frac{t}{\tau_{fall}}\right)$$

USE LEASTSQUARES
METHOD TO ESTIMATE
$\tau_{fall}$

POWER AMPLIFIER (PA) SELF-HEATING TRACKING FOR WITH SELF-HEATING TIME CONSTANT ESTIMATION

BACKGROUND

Self-heating effects can affect the performance of certain semiconductor devices, such as fin field-effect transistor (FinFET) devices and silicon on insulator (SOI) devices. Contrary to bulk CMOS devices, self-heating in FinFET or SOI devices typically has a very short thermal time (e.g., in the range of 10-100 nanoseconds (ns)). Heating and cooling with a very short time constant (e.g., in the range of 10 ns) can cause a thermal memory effect for an on-chip power amplifier (PA). This issue is exacerbated if there is an asymmetry between heating and cooling time constants. For example, self-heating with a short thermal time-constant may cause an envelope dependent bias for a power amplifier, and which may subsequently limit the performance of a wide-band on-chip power amplifier due to memoryless digital pre-distortion. Finding or estimating the self-heating thermal time constant in a real circuit environment helps to develop circuits and algorithms accordingly that can overcome self-heating effects to enable a linear PA in a FinFET device or in an SOI device. Therefore, there is a need for a technique that can reliably estimate the self-heating time constant in a semiconductor device, especially in a FinFET device or an SOI device.

SUMMARY

Embodiments of self-heating tracking circuits for a PA are disclosed. In an embodiment, a self-heating tracking circuit for a PA includes a PA replica circuit in proximity to the PA and an estimation unit configured to estimate a self-heating time constant of the PA in response to turning on the PA replica circuit and turning off the PA replica circuit. Other embodiments are also described.

In an embodiment, the PA is a FinFET device.

In an embodiment, the PA is an SOI device.

In an embodiment, the PA replica circuit is located within one micrometer (µm) of the PA such that a temperature of the PA replica circuit tracks with a temperature of the PA.

In an embodiment, the PA replica circuit includes a first transistor in proximity to a second transistor of the PA.

In an embodiment, the first transistor is located within one hundred nanometers (nm) of the second transistor of the PA such that a temperature of the PA replica circuit tracks with a temperature of the PA.

In an embodiment, the PA replica circuit further includes a third transistor connected to the first transistor and configured to be turned on or off.

In an embodiment, the estimation unit is further configured to estimate the self-heating time constant of the PA in response to turning on the PA replica circuit and turning off the PA replica circuit using a first order single-pole model.

In an embodiment, the estimation unit is further configured to estimate the self-heating time constant of the PA in response to turning on the PA replica circuit and turning off the PA replica circuit using a rising step response model.

In an embodiment, the estimation unit is further configured to estimate the self-heating time constant of the PA in response to turning on the PA replica circuit and turning off the PA replica circuit using a falling step response model.

In an embodiment, the self-heating tracking circuit further includes a bias circuit connected between the PA and the PA replica circuit.

In an embodiment, the bias circuit includes a first current source connected to a first voltage, a first transistor connected to the first current source and to the first voltage, a second transistor connected to the first current source, and a third transistor connected to the second transistor and to a reference voltage.

In an embodiment, the bias circuit further includes a second current source connected to the first transistor and to the reference voltage and a transformer connected to the third transistor and to the PA.

In an embodiment, a self-heating tracking circuit for a FinFET PA includes a PA replica circuit in proximity to the FinFET PA, where a temperature of the PA replica circuit tracks with a temperature of the FinFET PA, and an estimation unit configured to estimate a self-heating time constant of the FinFET PA in response to turning on the PA replica circuit and turning off the PA replica circuit.

In an embodiment, the PA replica circuit is located within one hundred nm of the FinFET PA.

In an embodiment, the PA replica circuit includes a first transistor in proximity to a second transistor of the FinFET PA and a third transistor connected to the first transistor and configured to be turned on or off.

In an embodiment, the estimation unit is further configured to estimate the self-heating time constant of the FinFET PA in response to turning on the PA replica circuit and turning off the PA replica circuit using a first order single-pole model.

In an embodiment, the self-heating tracking circuit further includes a bias circuit connected between the FinFET PA and the PA replica circuit.

In an embodiment, a self-heating tracking circuit for a PA includes a PA replica circuit located within one µm of the PA such that a temperature of the PA replica circuit tracks with a temperature of the PA, where the PA is a FinFET device or an SOI device, and an estimation unit configured to estimate a self-heating time constant of the PA in response to turning on the PA replica circuit and turning off the PA replica circuit.

In an embodiment, the estimation unit is further configured to estimate the self-heating time constant of the PA in response to turning on the PA replica circuit and turning off the PA replica circuit using a first order single-pole model.

Other aspects in accordance with the invention will become apparent from the following detailed description, taken in conjunction with the accompanying drawings, illustrated by way of example of the principles of the invention.

BRIEF DESCRIPTION OF THE DRAWINGS

FIG. 9 is a system model of a PA that can be used for parameter estimation of the self-heating tracking PA replica bias circuit depicted in FIG. 4.

FIG. 10 depicts an example waveform of a PA input.

FIG. 11 depicts an example waveform of a PA output.

Throughout the description, similar reference numbers may be used to identify similar elements.

DETAILED DESCRIPTION

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment", "an embodiment", or similar language means that a particular feature, structure, or characteristic described in connection with the indicated embodiment is included in at least one embodiment of the present invention. Thus, the phrases "in one embodiment", "in an embodiment", and similar language throughout this specification may, but do not necessarily, all refer to the same embodiment.

Figure 1:
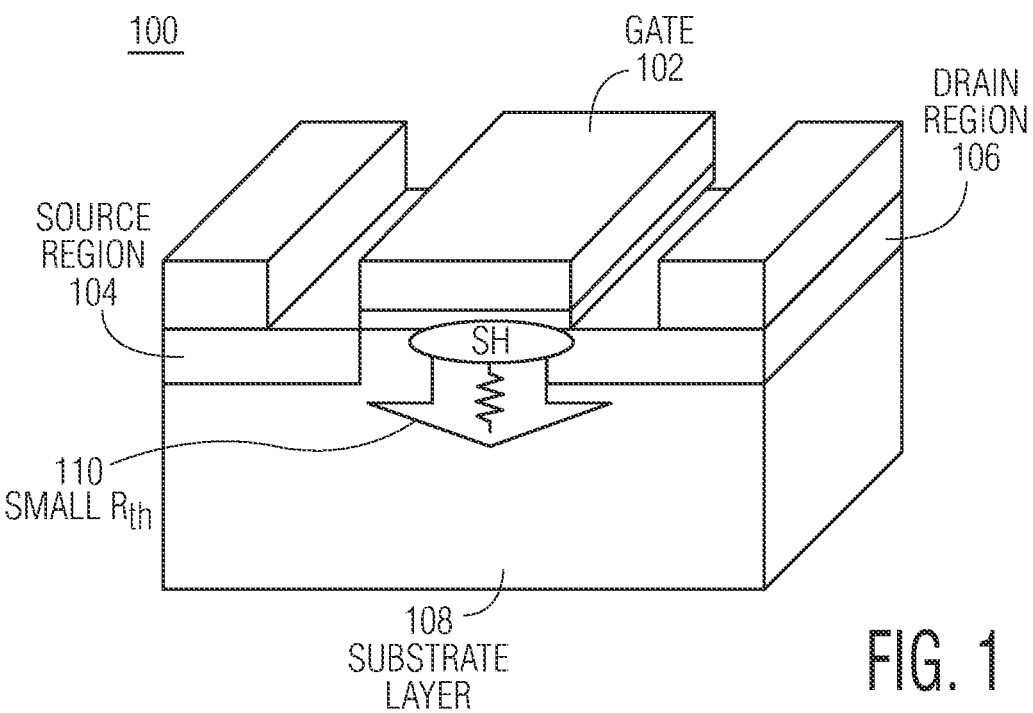
FIG. 1 depicts a planar metal-oxide-semiconductor field-effect transistor (MOSFET).

FIG. 1 depicts a planar MOSFET 100 that includes a gate 102, a source region 104, a drain region 106, and a substrate layer 108. In the planar MOSFET 100 depicted in FIG. 1, the heat dissipation path 110 to the substrate layer is relatively short and the substrate layer 108 is a good heat sink.

Figure 2:
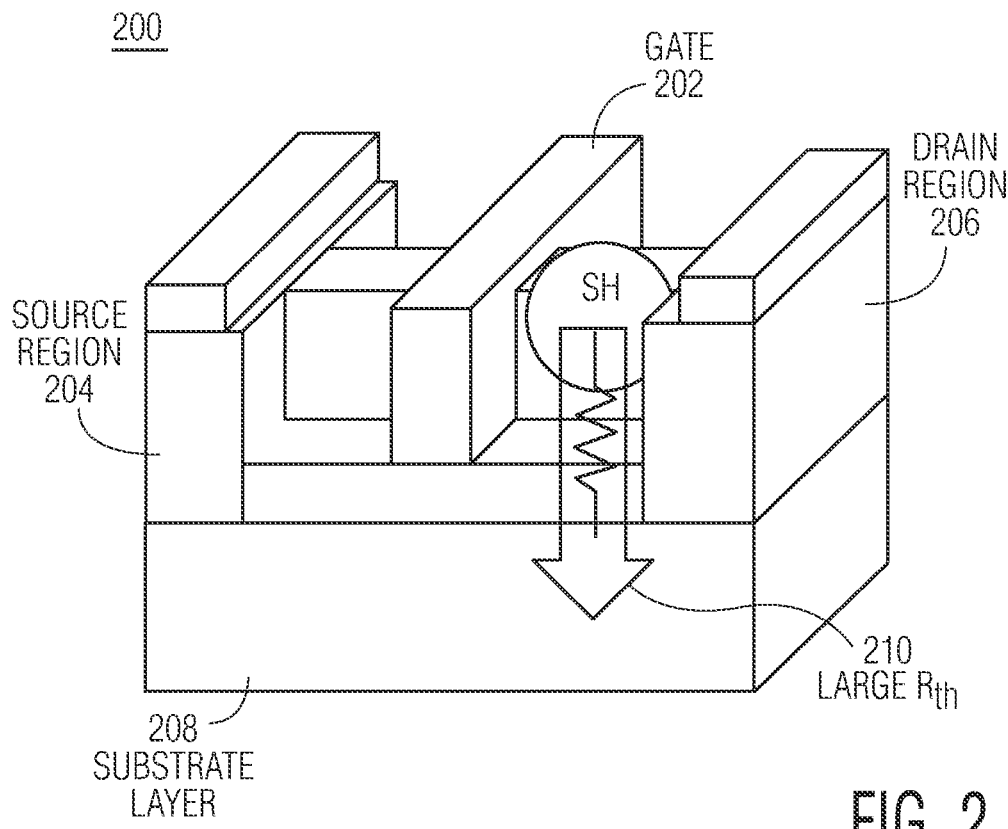
FIG. 2 depicts a FinFET device.

FIG. 2 depicts a FinFET device 200 that includes a gate 202, a source region 204, a drain region 206, and a substrate layer 208. In the FinFET device 200 depicted in FIG. 2, the heat dissipation path 210 from fins to the substrate layer is longer and confined, compared to the heat dissipation path 110 of the planar MOSFET 100 depicted in FIG. 1. Consequently, self-heating effects can affect the performance of the FinFET device 200. For example, self-heating effects can lead to envelope dependent bias and heat memory effects. Contrary to bulk CMOS devices, self-heating in the FinFET device 200 typically has a very short thermal time (e.g., in the range of 10-100 ns). Temperature increase can be based on thermal resistance ($R_{TH}$) and average power (W/m). Generally, the thermal resistance ($R_{TH}$) of the FinFET device 200 is larger than the thermal resistance ($R_{TH}$) of the planar MOSFET 100. Consequently, the temperature increase in the FinFET device 200 is higher than the temperature increase in the planar MOSFET 100. Device cooling time may be much longer than device heating time. However, self-heating time constant may not be available because of the complexity of device level simulation. For example, full three-dimensional (3D) device level simulation with all the metal connections is needed to extract the thermal time constant. However, the full 3D device level simulation is very complex and time consuming. In addition, the self-heating time constant is highly dependent on circuit layout. Heating and cooling with a very short time constant can cause thermal memory effect for an on-chip PA of the FinFET device 200. This issue is even more exacerbated in the case of asymmetric heating and cooling time constants. Finding or estimating the self-heating thermal time constant in the FinFET device 200 helps to develop circuits and algorithms accordingly that can overcome self-heating effects and enable, for example, a linear PA in the FinFET device 200.

Figure 3:
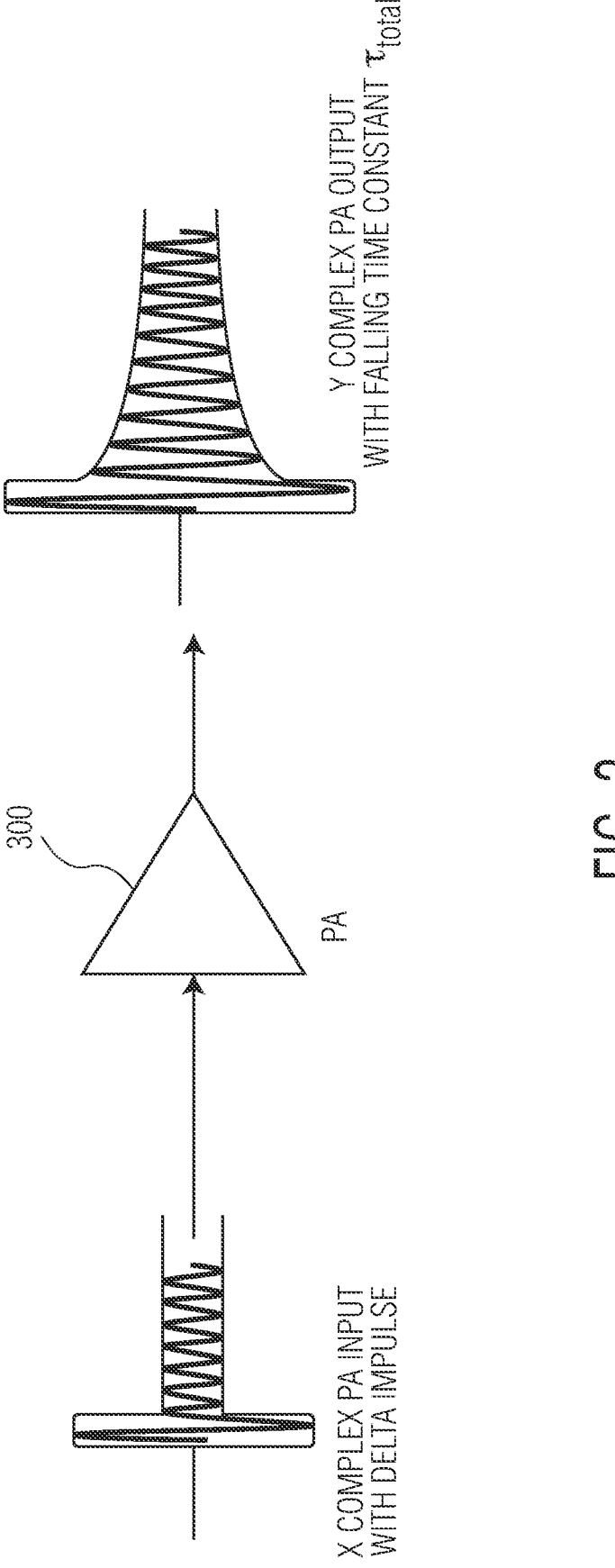
FIG. 3 depicts an input/output signal model for a PA.

FIG. 3 depicts an input/output signal model for a PA 300. The PA 300 has an input X, which is the complex PA input with delta impulse and an output Y, which is the complex PA output with falling time constant $\tau_{total}$. The output Y of the PA 300 can be expressed as:

$$y = a_o + a_1 x + a_2 x^2 + a_3 x^3 + a_4 x^4 + a_5 x^5, \tag{1}$$

where $a_0$, $a_1$, $a_2$, $a_3$, $a_4$, and $a_5$ represent gain coefficients. The output Y of the PA 300 can be further expressed as:

$$y = \left[ A_0 + A_{bias} e^{-\tau_{bias} \cdot t} + A_{supply} e^{-\tau_{supply} \cdot t} + A_{SHE} e^{-\tau_{SHE} \cdot t} \right] \cdot x, \tag{2}$$

where $A_0$, $A_{bias}$, $A_{supply}$, and $A_{SHE}$ represent gain coefficients ($A_0$ being the intrinsic PA Gain without self-heating effect, $A_{bias}$ being the PA bias memory effect Gain coefficient, $A_{supply}$ being the PA supply memory effect gain coefficient, and $A_{SHE}$ being the PA thermal self-heating effect gain coefficient), $\tau_{bias}$ represents PA bias time constant, $\tau_{supply}$ represents PA supply time constant, and $\tau_{SHE}$ represents PA self-heating thermal time constant. By dynamically switching on self-heating and off self-heating, the PA self-heating thermal time constant $\tau_{SHE}$ can be obtained. For example, the output $y_{no\_SHE}$ of the PA 300 without self-heating effects can also be expressed as:

$$y_{no\_SHE} = \left[ A_0 + A_{bias}e^{-\tau_{bias}\cdot t} + A_{supply}e^{-\tau_{supply}\cdot t} \right]\cdot x, \quad (3)$$

and the output $y_{SHE}$ of the PA 300 with self-heating effects can also be expressed as:

$$y_{SHE} = \left[ A_0 + A_{bias}e^{-\tau_{bias}\cdot t} + A_{supply}e^{-\tau_{supply}\cdot t} + A_{SHE}e^{-\tau_{SHE}\cdot t} \right]\cdot x \quad (4)$$

Consequently, the difference between the output $y_{SHE}$ of the PA 300 with self-heating effects and the output $y_{no\_SHE}$ of the PA 300 without self-heating effects can be expressed as:

$$y_{SHE} - y_{no\_SHE} = \left[ A_{SHE}e^{-\tau_{SHE}\cdot t} \right]\cdot x \quad (5)$$

The PA self-heating thermal time constant $\tau_{SHE}$ can be obtained based on the difference between the output $y_{SHE}$ of the PA 300 with self-heating effects and the output $y_{no\_SHE}$ of the PA 300 without self-heating effects.

In some embodiments, a PA with transconductance (Gm) and a corresponding PA replica circuit are placed in an interleave fashion. The PA has real RF input with self-heating effects while the PA replica circuit can track with PA temperature due to the proximity (e.g., within a distance of 1 μm or even one hundred nanometers (nm)) to the PA active Gm cell. In some embodiments, the PA and the PA replica circuit are fabricated in the same substrate of the same IC device. The PA replica circuit and the PA have similar thermal profiles. By turning on the PA replica circuit and turning off the PA replica circuit, a self-heating time constant of the PA can be estimated. Finding or estimating the self-heating thermal time constant of the PA can help to develop circuits and algorithms accordingly that can overcome self-heating effects and enable, for example, a linear PA.

Figure 4:
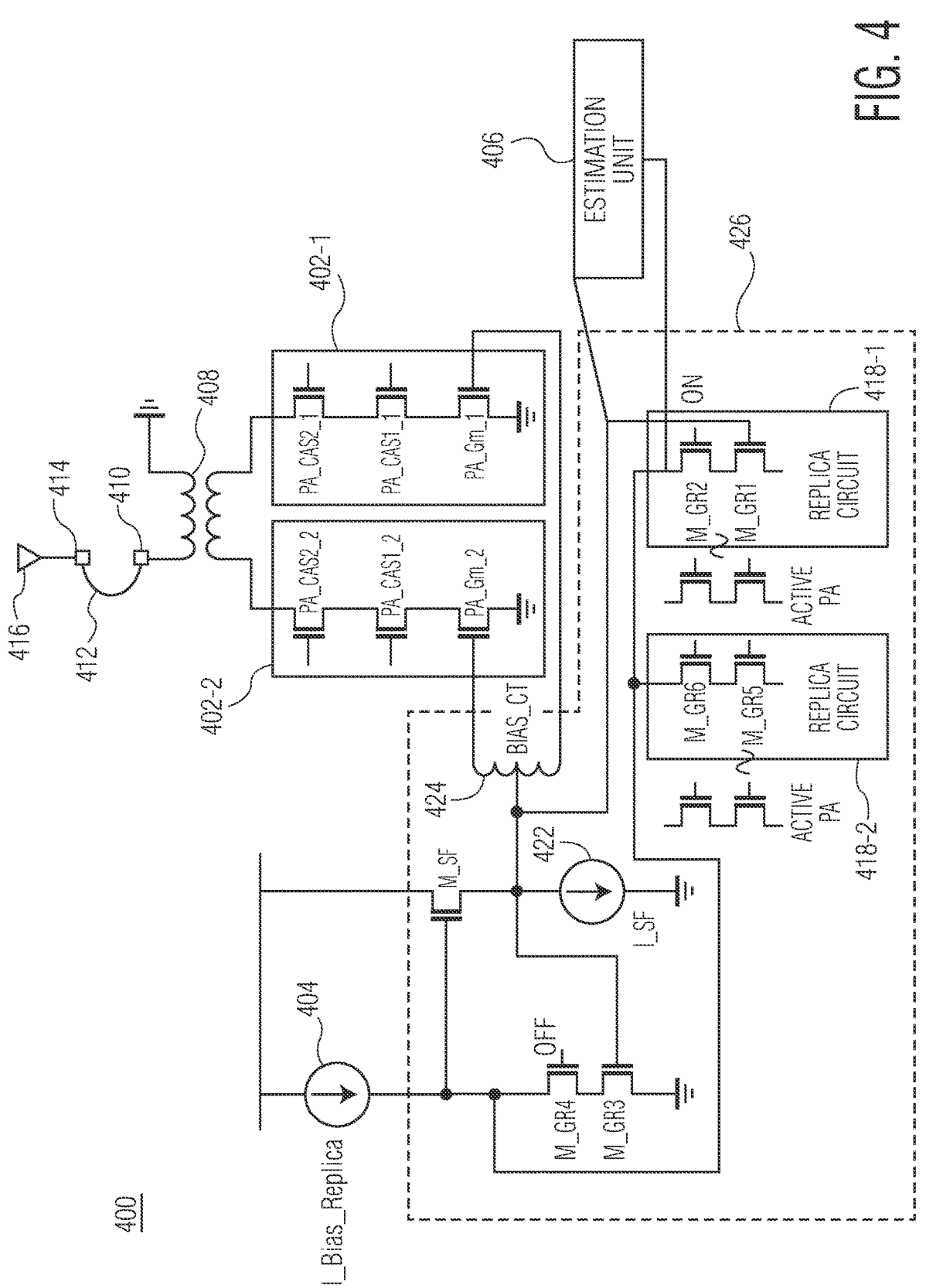
FIG. 4 is a schematic block diagram of a self-heating tracking PA replica bias circuit in accordance with an embodiment of the invention.

FIG. 4 is a schematic block diagram of a self-heating tracking PA replica bias circuit 400 in accordance with an embodiment of the invention. In the embodiment depicted in FIG. 4, the self-heating tracking PA replica bias circuit 400 includes two PAs 402-1, 402-2, a current source 404 configured to generate a reference current I_Bias_Replica, an estimation unit 406, a transformer 408, replica circuits 418-1, 418-2 in proximity to the PAs 402-1, 402-2, transistors M_SF, M_GR3, M_GR4, a current source 422 configured to generate a current I_SF, and a PA input transformer 424 with a bias point Bias_CT pointing to the center tap of the PA input transformer 424. The PAs 402-1, 402-2 include two PA first cascode N-channel metal-oxide-semiconductor (NMOS) transistors PA_CAS1_1, PA_CAS1_2, two PA second cascode NMOS transistors PA_CAS2_1, PA_CAS2_2, and two PA Gm NMOS transistors PA_Gm_1, PA_Gm_2. In some embodiments, an input terminal 410 is connected to the transformer 408 and an electrical wire or connection 412, which is connected to a terminal 414 that may be connected to an RF input, for example, an antenna 416. In some embodiments, the PAs 402-1, 402-2 are FinFET devices or silicon on insulator (SOI) devices with substantial self-heating effects. In the embodiment depicted in FIG. 4, the current source 404, the transistors M_SF, M_GR3, M_GR4, the current source 422, and the PA input transformer 424 form a bias circuit connected between the PAs 402-1, 402-2 and the replica circuits 418-1, 418-2. The current source 404 is connected to a voltage rail with the first voltage, the transistor M_SF is connected to the current source 404 and to the first voltage, the transistor M_GR4 is connected to the current source 404, the transistor M_GR3 is connected to the transistor M_GR4 and to a reference voltage (e.g., the ground), the current source 422 is connected to the transistor M_SF and to the reference voltage (e.g., the ground), and the transformer 424 is connected to the transistor M_GR3 and to the PAs 402-1, 402-2.

In the embodiment depicted in FIG. 4, the PAs 402-1, 402-2 and the replica circuits 418-1, 418-2 are placed in an interleave fashion. The PAs 402-1, 402-2 have real RF input with self-heating effects while the replica circuits 418-1, 418-2 can track with PA temperature due to the proximity (e.g., within a distance of 1 μm or even one hundred nm) to the PAs 402-1, 402-2. In some embodiments, the PAs 402-1, 402-2 and the replica circuits 418-1, 418-2 are fabricated in the same substrate of the same IC device. The replica circuits 418-1, 418-2 and the PAs 402-1, 402-2 have similar thermal profiles. In the self-heating tracking PA replica bias circuit 400 depicted in FIG. 4, the transistors M_SF, M_GR3, M_GR4, the current source 422, the PA input transformer 424, and the replica circuits 418-1, 418-2 form a replica feedback loop 426, which can force the reference current to mirror the current to the two PAs 402-1, 402-2.

In the embodiment depicted in FIG. 4, the estimation unit 406 is configured to estimate a self-heating time constant of the PAs 402-1, 402-2 in response to turning on the replica circuits 418-1, 418-2 and turning off the replica circuits 418-1, 418-2. In some embodiments, the estimation unit is further configured to estimate the self-heating time constant of the PAs 402-1, 402-2 in response to turning on the replica circuits 418-1, 418-2 and turning off the replica circuits 418-1, 418-2 using a first order single-pole model. For example, the estimation unit is further configured to estimate the self-heating time constant of the PAs 402-1, 402-2 in response to turning on the replica circuits 418-1, 418-2 and turning off the replica circuits 418-1, 418-2 using a rising step response model or a falling step response model. The estimation unit 406 may be implemented by at least one processor (e.g., a microcontroller, a digital signal processor (DSP), a central processing unit (CPU), or an embedded processor).

In the embodiment depicted in FIG. 4, the replica circuit 418-1 includes two transistors M_GR1, M_GR2. The transistor M_GR1 is in proximity to (e.g., within a distance of 1 μm or even one hundred nm) one of the PA_Gm NMOS transistors PA_Gm_1, PA_Gm_2 that have real RF input with self-heating effects such that the transistor M_GR1 can track with PA Gm temperature of the PA_Gm NMOS transistors PA_Gm_1, PA_Gm_2. The transistor M_GR1 and the PA_Gm NMOS transistors PA_Gm_1, PA_Gm_2 have similar thermal profiles. The transistor M_GR_1 has bias replica to the PA_Gm NMOS transistors PA_Gm_1, PA_Gm_2 and senses the FinFET self-heating effects of the PA_Gm NMOS transistors PA_Gm_1, PA_Gm_2 with active RF signal input. The transistor M_GR2 is configured to be turned on or off to select self-heating tracking or no self-heating tracking for the transistor M_GR1. For example, when the transistor M_GR2 is turned on (i.e., being conductive), self-heating tracking by the transistor M_GR1 is turned on, and when the transistor M_GR2 is turned off (i.e., not being conductive), self-heating tracking by the transistor M_GR1 is turned off.

In the embodiment depicted in FIG. 4, the replica circuit 418-2 includes two transistors M_GR5, M_GR6. The transistor M_GR5 is in proximity to (e.g., within a distance of 1 μm or even one hundred nm) one of the PA_Gm NMOS transistors PA_gm_1, PA_gm_2 that have real RF input with self-heating effects such that the transistor M_GR5 can track with PA Gm temperature of the PA_Gm NMOS transistors PA_Gm_1, PA_Gm_2. The transistor M_GR5 and the PA_Gm NMOS transistors PA_Gm_1, PA_Gm_2 have similar thermal profiles. The transistor M_GR5 has bias replica to the PA_Gm NMOS transistors PA_Gm_1, PA_Gm_2 and senses the FinFET self-heating effects of the PA_Gm NMOS transistors PA_Gm_1, PA_Gm_2 with active RF signal input. The transistor M_GR6 is configured to be turned on or off to select self-heating tracking or no self-heating tracking for the transistor M_GR5. For example, when the transistor M_GR6 is turned on (i.e., being conductive), self-heating tracking by the transistor M_GR5 is turned on, and when the transistor M_GR6 is turned off (i.e., not being conductive), self-heating tracking by the transistor M_GR5 is turned off.

In the embodiment depicted in FIG. 4, the transistor M_GR3 has bias replica to the PA_Gm NMOS transistors PA_Gm_1, PA_Gm_2 without sensing the temperature of the PA_Gm NMOS transistors PA_Gm_1, PA_Gm_2. The transistor M_GR4 can be turned off or on to select self-heating tracking or no self-heating tracking. For example, when the transistor M_GR4 is turned on (i.e., being conductive), self-heating tracking is turned off, and when the transistor M_GR4 is turned off (i.e., not being conductive), self-heating tracking is turned on. The transistor M_SF is the active NMOS that acts as a source follower. The current source 422 generates bias current I_SF for the transistor M_SF.

Figure 5:
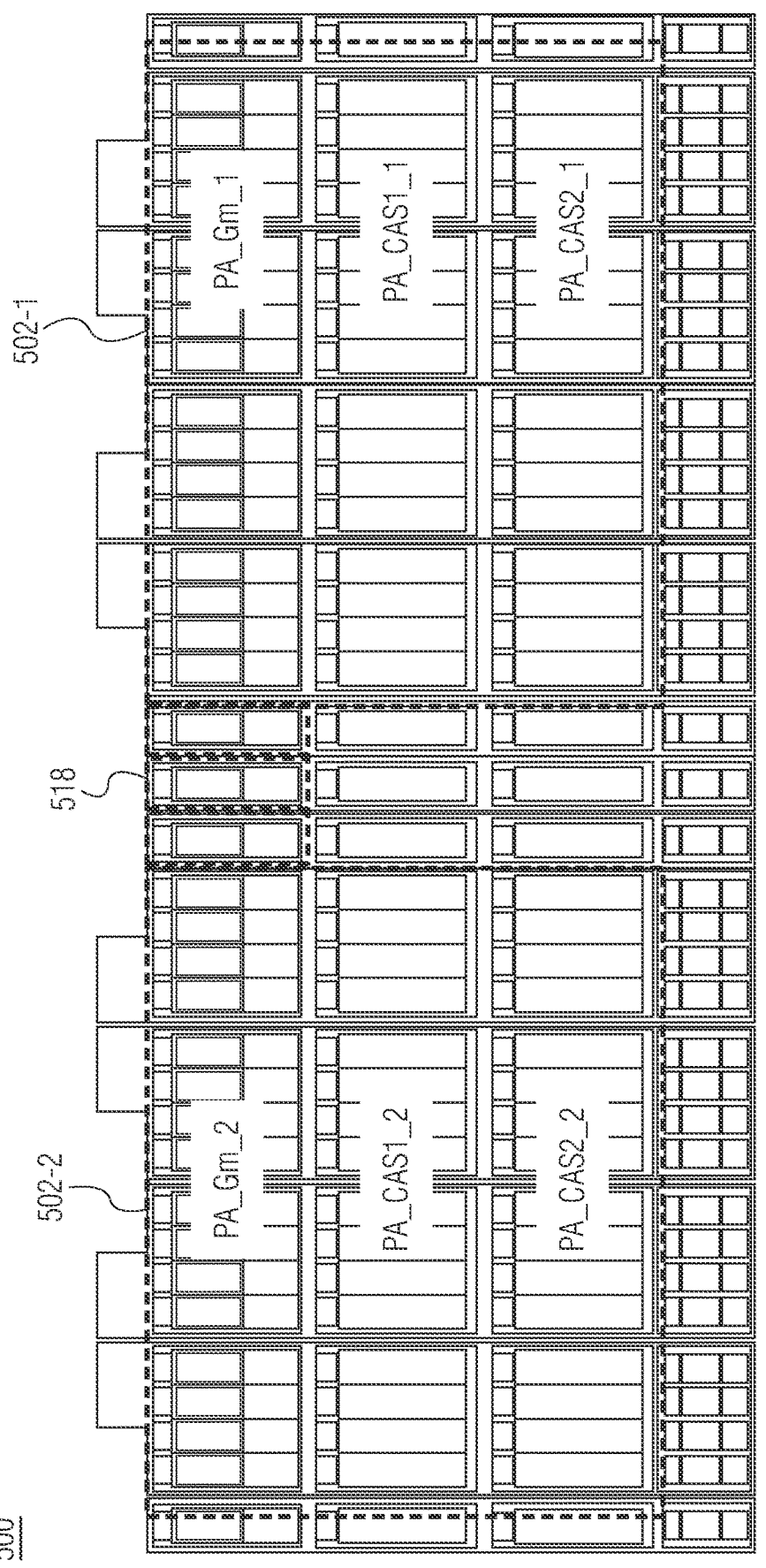
FIG. 5 is a circuit layout diagram that corresponds to the self-heating tracking PA replica bias circuit depicted in FIG. 4 in accordance with an embodiment of the invention.
Figure 6:
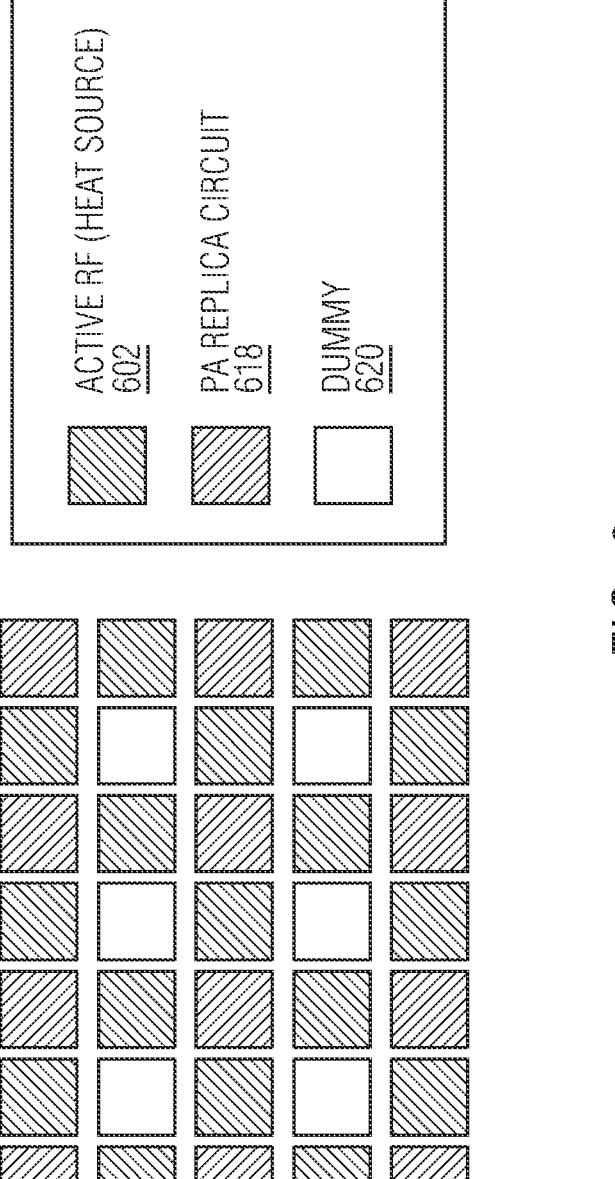
FIG. 6 is a circuit element map that corresponds to the circuit layout diagram depicted in FIG. 5.

FIG. 5 is a circuit layout diagram 500 that corresponds to the self-heating tracking PA replica bias circuit 400 depicted in FIG. 4 in accordance with an embodiment of the invention. In the circuit layout diagram 500 depicted in FIG. 5, an interleaved layout is between active PAs 502-1, 502-2 with first cascode NMOS transistors PA_CAS1_1, PA_CAS1_2, second cascode NMOS transistors PA_CAS2_1, PA_CAS2_2, and PA Gm NMOS transistors PA_Gm_1, PA_Gm_2 and a PA replica circuit 518. The distance between the bias PA replica 518 and the active PAs is within a distance of 1 μm or even one hundred nm such that the bias PA replica 518 can track with PA Gm temperature due to the proximity to the active PAs. In the circuit layout diagram 500 depicted in FIG. 5, the active PAs 502-1, 502-2 and the bias PA replica 518 are fabricated in the same substrate of the same IC device. In a circuit design where a bias PA replica is far away (e.g., 15 μm away) from a corresponding active PA, FinFET self-heating is a localized effect of the active PA and PA bias replica is not tracking with the active PA. FIG. 6 is a circuit element map 600 that corresponds to the circuit layout diagram 500 depicted in FIG. 5. In the circuit element map 600 depicted in FIG. 6, active PAs 602 that are heat sources, PA replica circuits 618, and dummy (e.g., non-functional or blank) circuit elements 620 are located next to each other.

Figure 7:
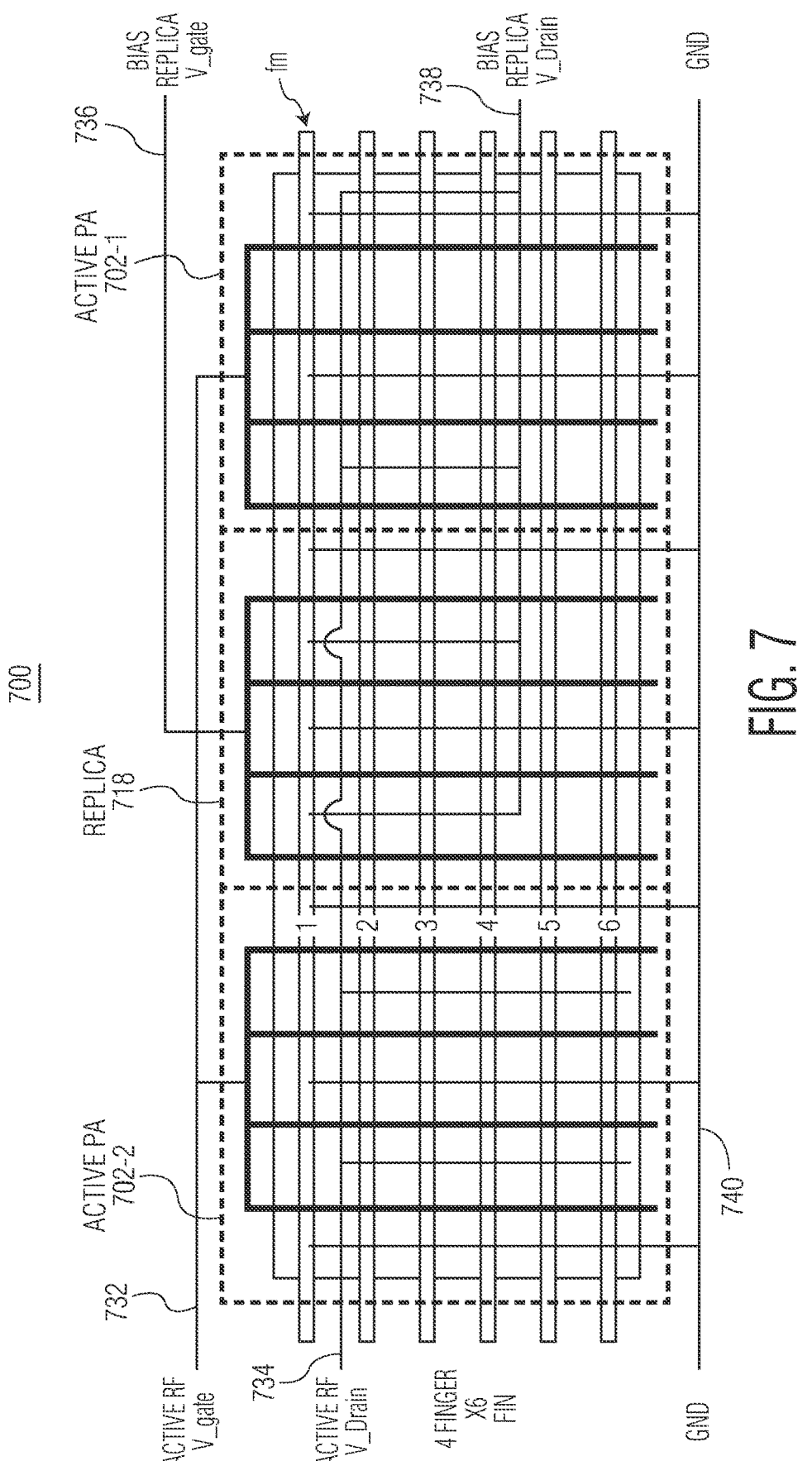
FIG. 7 is another circuit layout diagram that corresponds to the self-heating tracking PA replica bias circuit depicted in FIG. 4 in accordance with an embodiment of the invention.
Figure 8:
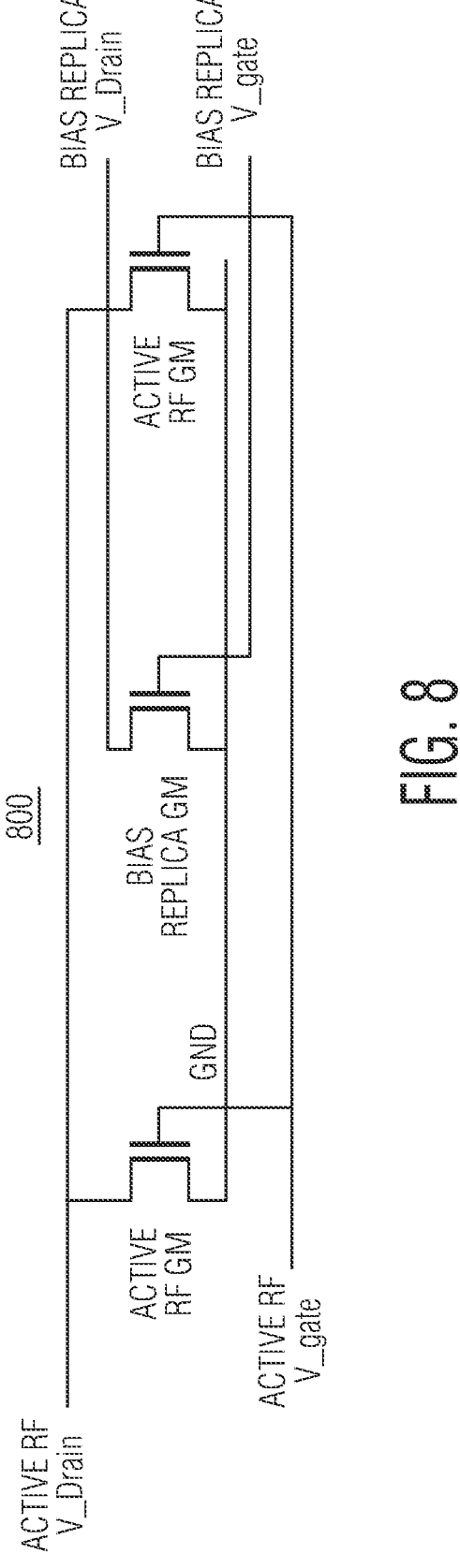
FIG. 8 is a circuit schematic diagram that corresponds to the circuit layout diagram depicted in FIG. 7.

FIG. 7 is another circuit layout diagram 700 that corresponds to the self-heating tracking PA replica bias circuit 400 depicted in FIG. 4 in accordance with an embodiment of the invention. In the circuit layout diagram 700 depicted in FIG. 7, an interleaved layout is between active PAs 702-1, 702-2 each with four fingers and six fins and a bias PA replica 718. The active PAs have a common gate rail 732 and a common drain rail 734, while the bias PA replica has a gate rail 736 and a drain rail 738. The active PA and the bias PA replica are connected to a ground voltage rail 740. FIG. 8 is a circuit schematic diagram 800 that corresponds to the circuit layout diagram 700 depicted in FIG. 7. In the circuit schematic diagram 800 depicted in FIG. 8, the active PAs have a common gate rail Active RF V_gate and a common drain rail Active RF V_Drain, while the bias PA replica has a gate rail Bias Replica V_gate and a drain rail. The active PA and the bias PA replica are both connected to a ground voltage rail Bias Replica V_Drain.

FIG. 9 is a system model 900 for a PA 902, which can be used for parameter estimation of the self-heating tracking PA replica bias circuit 400 depicted in FIG. 4. In the system model 900 depicted in FIG. 9, an estimation unit 906 is used to perform parameter estimation for a PA with an input X(t), a transfer function G(t), and an output Y(t). FIG. 10 depicts an example waveform 1000 of the input X(t) of the PA, and FIG. 11 depicts an example waveform 1100 of the output Y(t) of the PA. The estimation unit 906 depicted in FIG. 9 is an embodiment of the estimation unit 406 depicted in FIG. 4. The estimation unit 906 may be implemented by at least one processor (e.g., a microcontroller, a DSP, a CPU, or an embedded processor). In some embodiments, the estimation unit 906 is configured to estimate a self-heating time constant of the PA, for example, using a first order single-pole model. For example, the model estimation unit can model the gain of the PA as a single pole dynamical system, for example, using a first order single-pole model. In some embodiments, the model estimation unit extracts thermal time constants using step response of the system. Estimating self-heating time constant can be performed by turning on or off the self-heating tracking bias as described with reference to FIG. 4.

Figure 12:
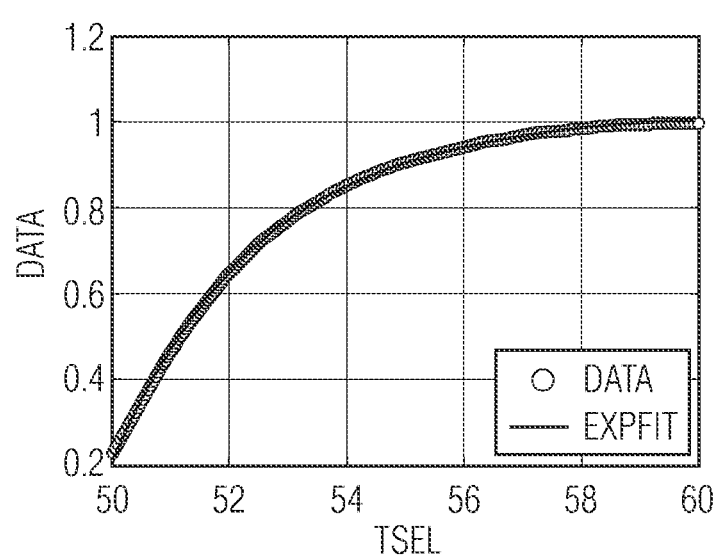
FIG. 12 is a rising step response model that can be used to estimate thermal time constants.

FIG. 12 is a rising step response model 1000 that can be used by the estimation unit 906 depicted in FIG. 9 to estimate thermal/self-heating time constants of the PA 902. For example, a rise time fit or curve time (t) function can be expressed as $$a\left(1 - \exp\left(-\frac{t}{\tau_{rise}}\right)\right),$$

a being the normalize intrinsic PA gain coefficient. The estimation unit can use a least-squares method to estimate a rising thermal/self-heating time constant $\tau_{rise}$.

Figure 13:
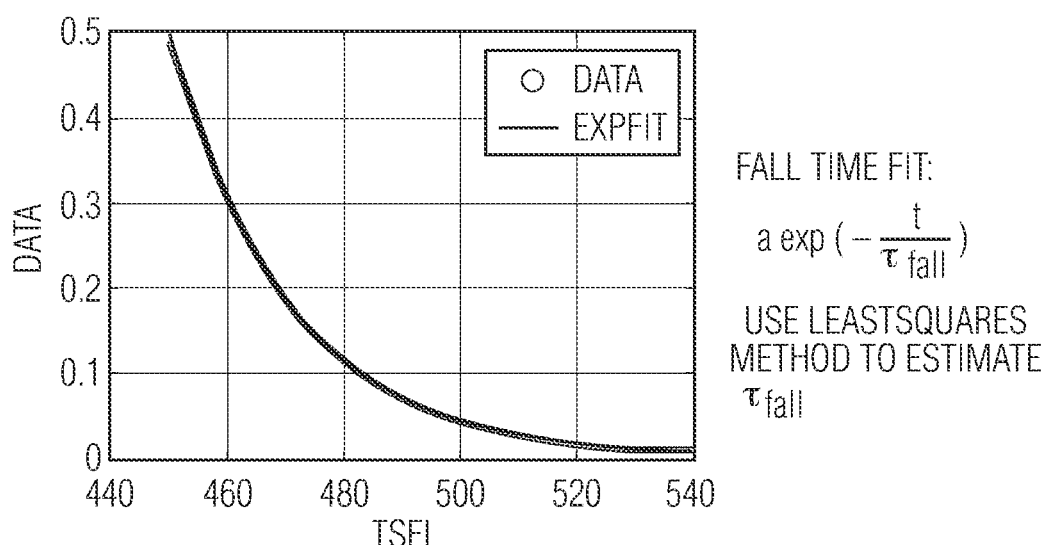
FIG. 13 is a falling step response model that can be used to estimate thermal time constants.

FIG. 13 is a falling step response model 1100 that can be used by the estimation unit 906 depicted in FIG. 9 to estimate thermal/self-heating time constants of the PA 902. For example, a fall time fit or curve time (t) function can be expressed as $$a\left(1 - \exp\left(-\frac{t}{\tau_{fall}}\right)\right),$$

a being the normalize intrinsic PA gain coefficient. The estimation unit can use a least-squares method to estimate a falling thermal/self-heating time constant $\tau_{fall}$.

In the above description, specific details of various embodiments are provided. However, some embodiments may be practiced with less than all of these specific details. In other instances, certain methods, procedures, components, structures, and/or functions are described in no more detail than to enable the various embodiments of the invention, for the sake of brevity and clarity.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

It should also be noted that at least some of the operations for the methods described herein may be implemented using software instructions stored on a computer useable storage medium for execution by a computer. As an example, an embodiment of a computer program product includes a computer useable storage medium to store a computer readable program. The computer-useable or computer-readable storage medium can be an electronic, magnetic, optical, electromagnetic, infrared, or semiconductor system (or apparatus or device). Examples of non-transitory computer-useable and computer-readable storage media include a semiconductor or solid-state memory, magnetic tape, a removable computer diskette, electrically erasable programmable read-only memory (EEPROM), a random access memory (RAM), a read-only memory (ROM), a rigid magnetic disk, and an optical disk. Current examples of optical disks include a compact disk with read only memory (CD-ROM), a compact disk with read/write (CD-R/W), and a digital video disk (DVD).

Alternatively, embodiments of the invention may be implemented entirely in hardware or in an implementation containing both hardware and software elements. In embodiments which use software, the software may include but is not limited to firmware, resident software, microcode, etc.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A self-heating tracking circuit for a power amplifier (PA), the self-heating tracking circuit comprising:
    a PA replica circuit in proximity to the PA; and
    an estimation unit configured to estimate a self-heating time constant of the PA in response to turning on the PA replica circuit and turning off the PA replica circuit.

2. The self-heating tracking circuit of claim 1, wherein the PA is a fin field-effect transistor (FinFET) device.

3. The self-heating tracking circuit of claim 1, wherein the PA is a silicon on insulator (SOI) device.

4. The self-heating tracking circuit of claim 1, wherein the PA replica circuit is located within one micrometer (μm) of the PA such that a temperature of the PA replica circuit tracks with a temperature of the PA.

5. The self-heating tracking circuit of claim 1, wherein the PA replica circuit comprises a first transistor in proximity to a second transistor of the PA.

6. The self-heating tracking circuit of claim 5, wherein the first transistor is located within one hundred nanometers (nm) of the second transistor of the PA such that a temperature of the PA replica circuit tracks with a temperature of the PA.

7. The self-heating tracking circuit of claim 5, wherein the PA replica circuit further comprises a third transistor connected to the first transistor and configured to be turned on or off.

8. The self-heating tracking circuit of claim 1, wherein the estimation unit is further configured to estimate the self-heating time constant of the PA in response to turning on the PA replica circuit and turning off the PA replica circuit using a first order single-pole model.

9. The self-heating tracking circuit of claim 1, wherein the estimation unit is further configured to estimate the self-heating time constant of the PA in response to turning on the PA replica circuit and turning off the PA replica circuit using a rising step response model.

10. The self-heating tracking circuit of claim 1, wherein the estimation unit is further configured to estimate the self-heating time constant of the PA in response to turning on the PA replica circuit and turning off the PA replica circuit using a falling step response model.

11. The self-heating tracking circuit of claim 1, further comprising a bias circuit connected between the PA and the PA replica circuit.

12. The self-heating tracking circuit of claim 11, wherein the bias circuit comprises:
    a first current source connected to a first voltage;
    a first transistor connected to the first current source and to the first voltage;
    a second transistor connected to the first current source; and
    a third transistor connected to the second transistor and to a reference voltage.

13. The self-heating tracking circuit of claim 12, wherein the bias circuit further comprises:
    a second current source connected to the first transistor and to the reference voltage; and
    a transformer connected to the third transistor and to the PA.

14. A self-heating tracking circuit for a fin field-effect transistor (FinFET) power amplifier (PA), the self-heating tracking circuit comprising:
    a PA replica circuit in proximity to the FinFET PA, wherein a temperature of the PA replica circuit tracks with a temperature of the FinFET PA; and
    an estimation unit configured to estimate a self-heating time constant of the FinFET PA in response to turning on the PA replica circuit and turning off the PA replica circuit.

15. The self-heating tracking circuit of claim 14, wherein the PA replica circuit is located within one hundred nanometers (nm) of the FinFET PA.

16. The self-heating tracking circuit of claim 14, wherein the PA replica circuit comprises:
    a first transistor in proximity to a second transistor of the FinFET PA; and
    a third transistor connected to the first transistor and configured to be turned on or off.

17. The self-heating tracking circuit of claim 14, wherein the estimation unit is further configured to estimate the self-heating time constant of the FinFET PA in response to turning on the PA replica circuit and turning off the PA replica circuit using a first order single-pole model.

18. The self-heating tracking circuit of claim 14, further comprising a bias circuit connected between the FinFET PA and the PA replica circuit.

19. A self-heating tracking circuit for a power amplifier (PA), the self-heating tracking circuit comprising:
    a PA replica circuit located within one micrometer (μm) of the PA such that a temperature of the PA replica circuit tracks with a temperature of the PA, wherein the PA is a fin field-effect transistor (FinFET) device or a silicon on insulator (SOI) device; and
    an estimation unit configured to estimate a self-heating time constant of the PA in response to turning on the PA replica circuit and turning off the PA replica circuit.

20. The self-heating tracking circuit of claim 19, wherein the estimation unit is further configured to estimate the self-heating time constant of the PA in response to turning on the PA replica circuit and turning off the PA replica circuit using a first order single-pole model.

* * * * *